(12) United States Patent
Jo et al.

(10) Patent No.: US 9,796,151 B2
(45) Date of Patent: Oct. 24, 2017

(54) PROTECTIVE WINDOW AND DISPLAY DEVICE INCLUDING THE SAME

(75) Inventors: Jong-Kap Jo, Yongin (KR); Akira Hirai, Yongin (KR); Chung-Soo Ha, Yongin (KR); Sung-Ki Jung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1042 days.

(21) Appl. No.: 13/333,892

(22) Filed: Dec. 21, 2011

(65) Prior Publication Data

US 2013/0004700 A1    Jan. 3, 2013

(30) Foreign Application Priority Data

Jun. 30, 2011  (KR) .................. 10-2011-0064890

(51) Int. Cl.
| | |
|---|---|
| B32B 27/08 | (2006.01) |
| B32B 3/14 | (2006.01) |
| B32B 27/36 | (2006.01) |
| H05K 5/06 | (2006.01) |
| C03C 17/32 | (2006.01) |
| H05K 5/02 | (2006.01) |
| B32B 27/28 | (2006.01) |

(52) U.S. Cl.
CPC .............. *B32B 3/14* (2013.01); *B32B 27/08* (2013.01); *B32B 27/365* (2013.01); *B32B 27/283* (2013.01); *B32B 2255/10* (2013.01); *B32B 2255/20* (2013.01); *C03C 17/32* (2013.01); *H05K 5/0243* (2013.01); *H05K 5/06* (2013.01); *Y10T 428/2495* (2015.01); *Y10T 428/263* (2015.01); *Y10T 428/31663* (2015.04)

(58) Field of Classification Search
CPC ..... B32B 27/08; B32B 27/365; B32B 27/283; B32B 2255/10; B32B 2250/20; B29L 2031/34811; C03C 17/32; H05K 5/06; H05K 5/0243; Y10T 428/2495; Y10T 428/263
See application file for complete search history.

(56) References Cited

U.S. PATENT DOCUMENTS

| | | | | |
|---|---|---|---|---|
| 4,191,804 | A | * | 3/1980 | Weber ...................... C08J 7/047 |
| | | | | 351/159.57 |
| 4,275,118 | A | * | 6/1981 | Baney .................. C09D 183/04 |
| | | | | 106/287.16 |
| 7,385,017 | B2 | | 6/2008 | Saito et al. |
| 2007/0014018 | A1 | * | 1/2007 | Wheatley et al. ............ 359/580 |

(Continued)

FOREIGN PATENT DOCUMENTS

| | | | |
|---|---|---|---|
| JP | 2002-167552 | * | 6/2002 |
| JP | 2008-037101 | * | 2/2008 |

(Continued)

OTHER PUBLICATIONS

Machine translation of cited reference JP2002-167552. Jun. 2002.*

*Primary Examiner* — Donald J Loney
(74) *Attorney, Agent, or Firm* — Knobbe, Martens, Olson & Bear, LLP

(57) ABSTRACT

In one aspect, a protective window comprising a first transparent member comprising a polymer; and a protective layer on a first surface of the first transparent member and comprising silsequioxane is provided.

18 Claims, 15 Drawing Sheets

(56) References Cited

U.S. PATENT DOCUMENTS

| | | | | |
|---|---|---|---|---|
| 2007/0088094 A1* | 4/2007 | Tamaki | ...................... | C08J 3/28 |
| | | | | 522/99 |
| 2009/0025727 A1* | 1/2009 | Klun et al. | ............... | 128/206.21 |
| 2009/0169896 A1* | 7/2009 | Sohn | ........................ | B05D 7/04 |
| | | | | 428/412 |
| 2010/0215976 A1 | 8/2010 | Suwa et al. | | |
| 2010/0273011 A1* | 10/2010 | Zhong | ...................... | B32B 7/12 |
| | | | | 428/429 |

FOREIGN PATENT DOCUMENTS

| | | | |
|---|---|---|---|
| JP | 2009-029881 | A | 2/2009 |
| JP | 2009-042351 | A | 2/2009 |
| JP | 2009-279806 | A | 12/2009 |
| JP | 2010-194809 | A | 9/2010 |
| KR | 10-2005-0109515 | A | 11/2005 |
| KR | 10-2010-0101570 | A | 9/2010 |

\* cited by examiner

PROTECTIVE WINDOW AND DISPLAY DEVICE INCLUDING THE SAME

CROSS-REFERENCE TO RELATED APPLICATIONS

This application claims priority to and the benefit of Korean Patent Application No. 10-2011-0064890 filed in the Korean Intellectual Property Office on Jun. 30, 2011, the disclosure of which is incorporated herein by reference in its entirety.

BACKGROUND

Field

The present disclosure relates to a protective window, and more particularly, to a protective window having a plurality of layers.

Description of the Related Technology

A protective window is used to protect an object from being damaged. When used in a display device, a protective window is placed over a front surface of the display device, on which an image is displayed, to protect elements (including an image display element) of the display device. Although the protective window is placed over the display device, an image displayed by the image display element of the display device should be visible to a user. Thus, the protective window is generally made of a transparent material.

As the use of portable display devices such as smart phones and portable media players (PMPs) increases, protective windows are increasingly required to have good strength properties to endure impact applied on the portable display devices. In addition, the protective windows are required to have good hardness properties in order to prevent the portable display devices from being scratched when brought into physical contact with other objects. Also, good durability is required.

Glass is a material widely used for protective windows. Glass protective windows have high transparency and high hardness but are heavy due to their high specific gravity, and expensive. Additionally, Glass protective windows may be broken by external impact.

SUMMARY

Some embodiments provide a protective window of a display device, the protective window containing a polymer and silsequioxane, being light, and having high hardness and high strength.

Some embodiments provide a protective window of a display device, the protective window containing a polymer and silsequioxane and being hardly deformed.

However, aspects of the present embodiments are not restricted to the one set forth herein. The above and other aspects of the present embodiments will become more apparent to one of ordinary skill in the art by referencing the detailed description of the present invention given below.

According to an aspect of the present embodiments, there is provided a protective window comprising a first transparent member which contains a polymer and a protective layer which is formed on a first surface of the first transparent member and contains silsequioxane.

According to another aspect of the present embodiments, there is provided a protective window comprising a first transparent member which contains a polymer, a protective layer which is formed on a first surface of the first transparent member and contains silsequioxane and a rear layer which is formed on a second surface of the first transparent member and contains silsequioxane.

According to an aspect of the present embodiments, there is provided a display device comprising a display unit and a protective window which is disposed over the display unit, wherein the protective window comprises a first transparent member which contains a polymer and a protective layer which is formed on a first surface of the first transparent member and contains silsequioxane.

The above and other aspects and features of the present embodiments will become more apparent with reference to the attached drawings.

DETAILED DESCRIPTION

The present disclosure will now be described more fully hereinafter with reference to the accompanying drawings, in which preferred embodiments of this disclosure are shown. This disclosure may, however, be embodied in many different forms and is not construed as limited to the exemplary embodiments set forth herein. Rather, these embodiments are provided so that this disclosure will be understood by those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Figure 1:
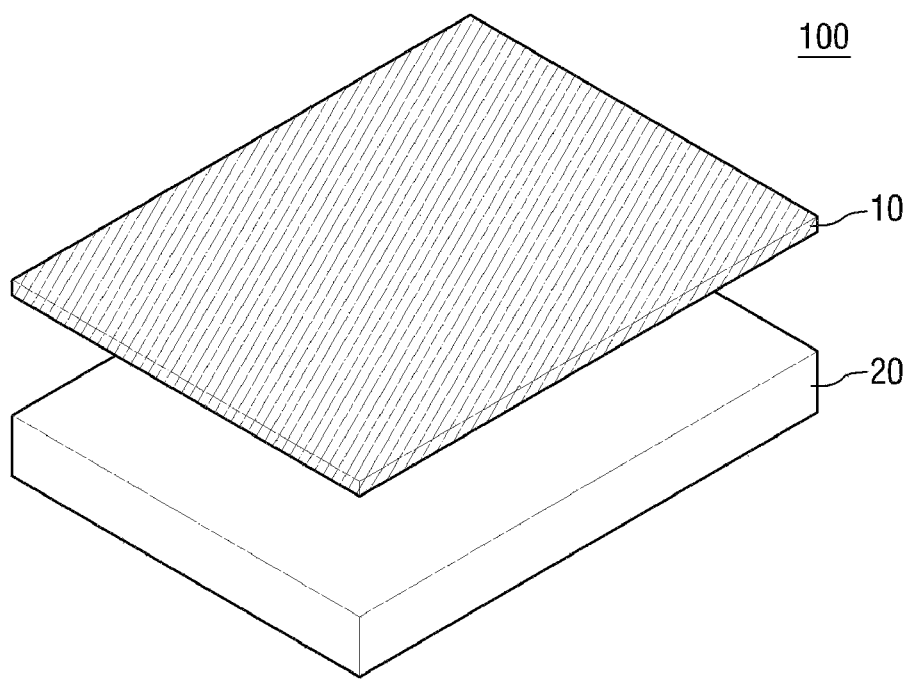
FIG. 1 is an exploded perspective view of a protective window according to an exemplary embodiment.
Figure 2:
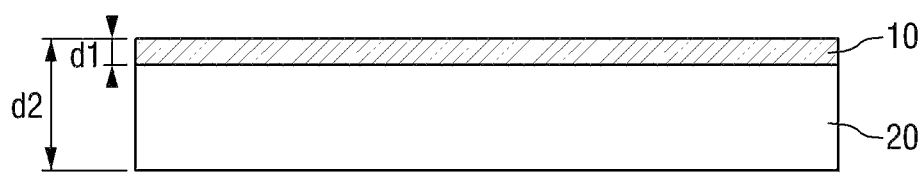
FIGS. 2 and 3 are cross-sectional views of a protective window according to an exemplary embodiment.
Figure 3:
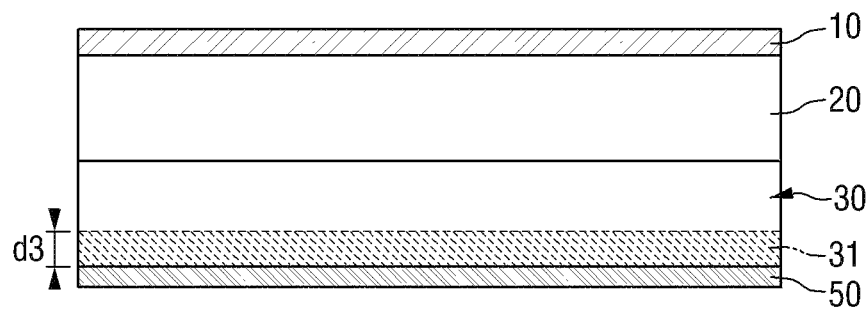

FIG. 1 is an exploded perspective view of a protective window 100 according to an exemplary embodiment. FIGS. 2 and 3 are cross-sectional views of the protective window according to the exemplary embodiment.

Referring to FIGS. 1 and 2, the protective window 100 according to the current exemplary embodiment may include a first transparent member 20 and a protective layer 10.

In some embodiments, the first transparent member 20 may contain a polymer. The polymer may be at least one of polycarbonate (PC), polymethylmethacrylate (PMMA), and polyethylene terephthalate (PET). In some embodiments, the polymer may not be limited to PC, PMMA or PET, but may also be any other polymer having a pencil hardness of approximately 4H or more and having high durability resulting from mechanical safety.

To achieve good surface hardness (pencil hardness) of the protective window 100, the polymer contained in the first transparent member 20 may be PET or PMMA. The relationship between the material of the polymer contained in the first transparent member 20 and the surface hardness of the protective window 100 is described in Experimental Example 1.

In some embodiments, the first transparent member 20 consists of one or more layers, and each of the layers contains a polymer. In some embodiments, the polymer contained in each of the layers may be at least one of PC, PMMA, and PET.

In some embodiments, the first transparent member 20 may be shaped like a rectangle. However, this shape is adopted for ease of description only. Since the protective window 100 including the first transparent member 20 is designed to protect a display device, the shape of the protective window 100 can be readily modified according to the shape of the display device to which the protective window 100 is attached.

In some embodiments, the protective layer 10 can contain silsequioxane. Silsequioxane is a kind of siloxane. As shown in Table 1 below, siloxane includes M, D, T and Q unit structures. Silsequioxane is a polymer including the T unit structure and may be represented by the chemical formula $(RSiO_{3/2})_n$. Silsequioxane can be formed by hydrolytic polymerization of $RSi(OR)_3$ or $RSiCl_3$. In some embodiments, silsequioxane may be formed not by hydrolytic polymerization but by methods known in the art.

In some embodiments, the protective layer 10 may have substantially the same shape as the first transparent member 20. Further, a first surface of the protective layer 10 may be the same size as a first surface of the first transparent member 20.

In some embodiments, the protective layer 10 can be formed on the first surface of the first transparent member 20. In some embodiments, the protective layer 10 may be attached to the first transparent member 20. In some embodiments, the protective layer 10 and the first transparent member 20 may be attached to each other using thermo-compression bonding, a UV light-curing adhesive, a pressure sensitive adhesive, or any other method known to those of ordinary skill in the art to which the present invention pertains.

To achieve good surface hardness (pencil hardness) of the protective window 100, a thickness of the protective layer 10 should be more than a predetermined value. In some embodiments, the predetermined value can be 10 μm, 50 μm 100 or 150 μm. This is because a thicker protective layer 10 leads to greater pencil hardness, i.e., surface hardness of the protective window 100. However, a thicker protective layer 10 increases the total thickness of the protective window 100, thus rendering the protective window 100 heavier. In addition, an excessively thick protective layer 10 may result in degraded fracture properties. For these reasons, the thickness of the protective layer 10 should be less than the predetermined value. In some embodiments, the predetermined value can be 200 μm, 150 μm 100 μm, or 50 μm. For example, the protective layer 10 may have a thickness of approximately 100 to 150 μm.

The relationship between the thickness of the protective layer 10 included in the first transparent member 20 and the surface hardness of the protective window 100 is described in Experimental Example 1.

Table 2 shows the results of measuring the pencil hardness and light transmittance of protective windows made of various combinations of a polymer, silsequioxane, and glass.

TABLE 1

| Q | T | D | M |
|---|---|---|---|
| —O—Si(O)(O)—O— $SiO_{4/2}$ | —O—Si(OR)(O)—O— $(RO)SiO_{3/2}$ | Polyorganooxysiloxanes (polysilic acid esters) —O—Si(OR)(OR)—O— $(RO)_2SiO_{2/2}$ | RO—Si(OR)(OR)—O— $(RO)_3SiO_{1/2}$ Organooxysiloxanes RO—Si(OR)(OR)—OR $(RO)_4SiO$ |
| | —O—Si(R)(O)—O— $RSiO_{3/2}$ | Polyorganooxysiloxanes (Silicone) —O—Si(R)(R)—O— $R_2SiO_{2/2}$ | R—Si(R)(R)—O— $R_3SiO_{1/2}$ Organosiloxanes R—Si(R)(R)—R $R_4Si$ |

TABLE 2

| | PMMM stacked on PC | Silsequioxane stacked on PC | Glass |
|---|---|---|---|
| Pencil hardness | 4 H | 9 H or more | 9 H or more |
| Transmittance | 91% | 92% | 92% |

Referring to Table 2 above, the protective window 100 having the silsequioxane-containing protective layer 10 stacked on the PC-containing first transparent member 20 is more advantageous in terms of pencil hardness than a protective window having PMMA stacked on PC. Therefore, the protective window 100 according to the current exemplary embodiment has higher hardness than the protective window using only polymers, but is not easily broken and is not easily deformed.

Moreover, the protective window 100 having the silsequioxane-containing protective layer 10 stacked on the PC-containing first transparent member 20 may have the same pencil hardness and light transmittance as a glass protective window. However, the glass protective window is heavy due to its high specific gravity, and is expensive to produce. Additionally, glass protective windows may be broken by external impact. On the other hand, the protective window 100 according to the current exemplary embodiment is relatively lighter, more durable, and less expensive to produce than the glass protective window while it has the same pencil hardness and light transmittance as the glass protective window.

Referring to FIG. 3, a protective window 100 according to another exemplary embodiment includes a protective layer 10, a first transparent member 20, a second transparent member 30, and an adhesive member 50.

In some embodiments, the second transparent member 30 can consist of one or more layers, and each of the layers contains a polymer. In some embodiments, the polymer contained in each of the layers may be at least one of PC, PMMA, and PET.

In some embodiments, the second transparent member 30 can be formed on a second surface of the first transparent member 20. In some embodiments, the second surface of the first transparent member 20 may be a surface different from a first surface of the first transparent member 20 on which the protective layer 10 is formed or may be a surface opposite to the first surface of the first transparent member 20. In some embodiments, the second transparent member 30 may be attached to the first transparent member 20. In some embodiments, the second transparent member 30 and the first transparent member 20 may be attached to each other using thermo-compression bonding, a UV light-curing adhesive, a pressure sensitive adhesive, or any other known method.

In some embodiments, the second transparent member 30 contains a polymer. In some embodiments, the polymer may be at least one of PC, PMMA, and PET. In some embodiments, the polymer may not be limited to PC, PMMA or PET, but may also be any other polymer having a pencil hardness of approximately 4H or more and having high durability resulting from mechanical safety.

In some embodiments, the surface hardness of the protective window 100 may depend on the material of the second transparent member 30. To achieve good surface hardness (pencil hardness) of the protective window 100, the second transparent member 30 may contain PMMA. The relationship between the material of the second transparent member 30 and the surface hardness of the protective window 100 is described in Experimental Example 1.

Warping properties of the protective window 100 may vary according to the material of the first transparent member 20 and the material of the second transparent member 30. To ensure that the protective window 100 has superior warping properties, the first transparent member 20 may contain PET. In this case, the second transparent member 30 may contain PMMA. The relationship between the materials of the first transparent member 20 and the second transparent member 30 and the warping properties of the protective window 100 is described in Experimental Example 1.

In some embodiments, the surface hardness or mechanical strength of the protective window 100 may depend on the material and thickness of the first transparent member 20 and the material and thickness of the second transparent member 30. To achieve good surface hardness (pencil hardness) or mechanical strength of the protective window 100, the first transparent member 20 may contain PET and have a thickness of approximately 50 μm. In this case, the second transparent member 30 may contain PMMA and have a thickness of approximately 0.5 mm or more.

An increase in the thickness of the second transparent member 30 leads to an increase in the surface hardness and mechanical strength of the protective window 100. However, the thicker second transparent member 30 makes the protective window 100 thicker and heavier and increases production costs. Therefore, if the protective window 100 has good pencil hardness, it is not necessary to increase the thickness of the second transparent member 30. For example, to achieve good surface hardness (pencil hardness) or mechanical strength of the protective window 100, the first transparent member 20 may contain PET and have a thickness of approximately 50 μm. In this case, the second transparent member 30 may contain PMMA and have a thickness of approximately 0.5 mm. The relationship between the thickness and material of the second transparent member 30 and the surface hardness or mechanical strength of the protective window 100 is described in Experimental Example 2.

In some embodiments, the surface hardness or mechanical strength of the protective window 100 may depend on the material and thickness of the first transparent member 20 and the material and thickness of the second transparent member 30. To achieve good surface hardness (pencil hardness) or mechanical strength of the protective window 100, the first transparent member 20 may contain PMMA and have a thickness of approximately 50 μm. In this case, the second transparent member 30 may contain PMMA and have a thickness of approximately 0.8 mm or more.

An increase in the thickness of the second transparent member 30 leads to an increase in the surface hardness and mechanical strength of the protective window 100. However, the thicker second transparent member 30 makes the protective window 100 thicker and heavier and increases production costs. Therefore, if the protective window 100 has good pencil hardness, it is not necessary to increase the thickness of the second transparent member 30. For example, to achieve good surface hardness (pencil hardness) or mechanical strength of the protective window 100, the first transparent member 20 may contain PMMA and have a thickness of approximately 50 μm. In this case, the second transparent member 30 may contain PMMA and have a thickness of approximately 0.8 mm. The relationship between the thickness and material of the second transparent member 30 and the surface hardness or mechanical strength of the protective window 100 is described in Experimental Example 2.

In some embodiments, the second transparent member 30 may include a lowest layer 31. Among a plurality of layers included in the second transparent member 30, the lowest layer 31 may be the last layer located on the opposite side of the second transparent member 30 from the first transparent member 20.

In some embodiments, the lowest layer 31 may contain PC. PC is a polymer with superior hardness. Therefore, the protective window 100 including the second transparent member 30 which includes the PC-containing lowest layer 31 has high resistance to impact and abrasion when brought into physical contact with an object to which the protective window 100 is attached.

In some embodiments, the adhesive member 50 can be used to position the protective window 100 on an object that is to be protected using the protective window 100. In some embodiments, the adhesive member 50 attaches the protective window 10 to a desired position on the object.

In some embodiments, the adhesive member 50 may be made of a transparent, adhesive material. In some embodiments, the adhesive member may be a pressure sensitive adhesive.

In some embodiments, the adhesive member 50 may be located at the bottom of the protective window 100. Here, "the bottom of the protective window 100" denotes the last position on the opposite side of the first transparent member 20 from the protective layer 10.

Figure 4:
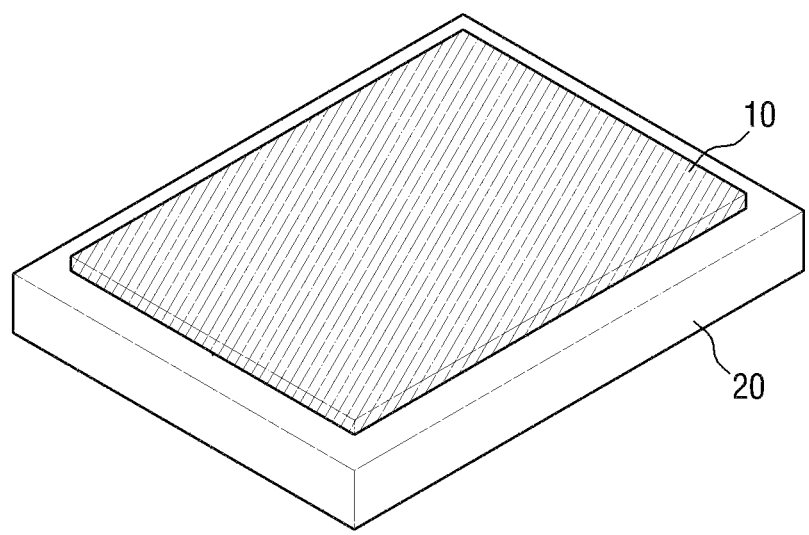
FIG. 4 is a perspective view of a protective window according to another exemplary embodiment.
Figure 5:
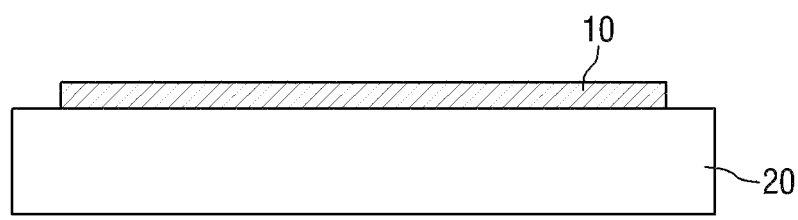
FIG. 5 is a cross-sectional view of the protective window of FIG. 4.

FIG. 4 is a perspective view of a protective window 100 according to another exemplary embodiment. FIG. 5 is a cross-sectional view of the protective window 100 of FIG. 4. FIGS. 6 through 9 are plan views of a first transparent member 20 according to an exemplary embodiment.

Referring to FIGS. 4 and 5, the protective window 100 may include a protective layer 10 and the first transparent member 20. Although not shown in the drawings, in some embodiments the protective window 100 may further include a second transparent member and an adhesive member.

Referring to FIGS. 4 and 5, the protective layer 10 may be formed on a region of a first surface of the first transparent member 20. In the drawings, the protective layer 10 is rectangular shaped. However, the shape of the protective layer 10 is not limited to a rectangle. The protective layer 10 having various shapes may be located on a region of the first surface of the first transparent member 20.

Various forms in which the protective layer 10 is placed on the first surface of the first transparent member 20 will now be described with reference to FIGS. 6 through 9.

Referring to FIGS. 6 through 9, the first transparent member 20 may include a first region 70, 71, 72 or 73 and a second region 80, 81, 82 or 83.

In some embodiments, the first region 70, 71, 72 or 73 of the first transparent member 20 may be a region of the first surface of the first transparent member 20 on which the protective layer 10 is disposed, and the second region 80, 81, 82 or 83 of the first transparent member 20 may be a region of the first surface of the first transparent member 20 on which the protective layer 10 is not disposed.

In some embodiments, when the protective window 100 is used to protect a display device, the first region 70, 71, 72 or 73 of the first transparent member 20 may correspond to a display region of the display device on which an image is displayed, and the second region 80, 81, 82 or 83 of the second transparent member 20 may correspond to a non-display region of the display device on which no image is displayed.

In addition, in some embodiments, when the protective window 100 is used to protect a device operated according to a user's touch input, such as a touch screen device, the first region 70, 71, 72 or 73 of the first transparent member 20 may correspond to an input unit which receives a user's touch input, and the second region 80, 81, 82 or 83 of the first transparent member 20 may correspond to a non-input unit.

In FIGS. 6 through 9, the first region 70, 71, 72 or 73 of the first transparent member 20 is drawn as a rectangular shape. However, the rectangular shape is merely an example used to describe the concept of the first region 70, 71, 72 or 73, and the first region 70, 71, 72 or 73 may have various shapes.

Figure 6:
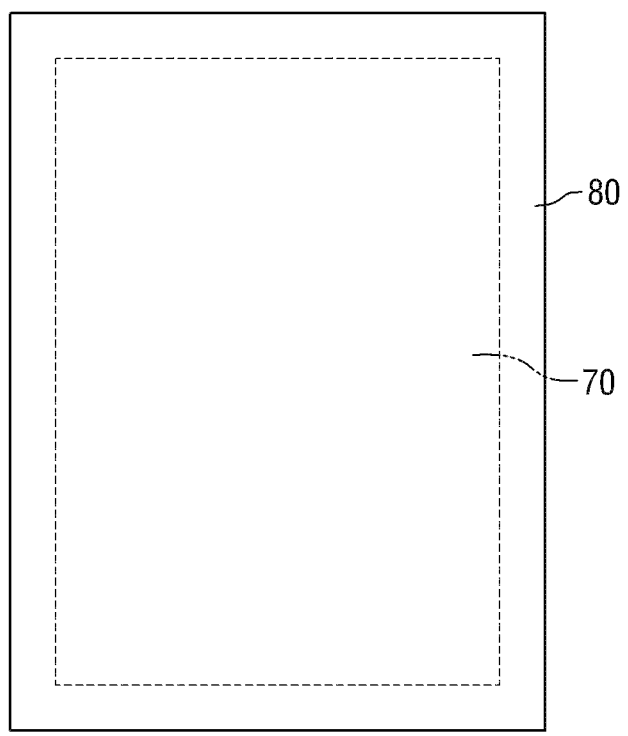
FIGS. 6 through 9 are plan views of a first transparent member according to an exemplary embodiment.

Referring to FIG. 6, the first region 70 of the first transparent member 20 may be a region corresponding to the center of the first surface of the first transparent member 70. In some embodiments, the second region 80 of the first transparent member 20 may be a region surrounding the first region 70 of the first surface of the first transparent member 20. In some embodiments, the protective layer 10 may be placed on the first region 70 of the first transparent member 20.

In some embodiments, the protective window 100 uses a silsequioxane-containing protective layer 10. Thus, the protective window 100 has higher hardness than a protective window using only polymers, but is not easily broken and is not easily deformed. Moreover, the protective window 100 having the silsequioxane-containing protective layer 10 is relatively lighter, more durable, and less expensive than a glass protective window while it has the same pencil hardness and light transmittance as the glass protective window.

As described above, when the protective window 100 is used in a display device, not all regions of the display device may display images. Only a region (i.e., a display region) of the display device may display an image while the other region (i.e., a non-display region) of the display device does not display an image. In this case, if the display region of the display device is damaged, a user's visibility of images may deteriorate. Thus, the display region requires higher hardness than the non-display region. In particular, as devices (such as touch screens) which receive touch inputs as user inputs increase, the display region is more vulnerable to scratches and abrasion. Accordingly, it becomes more important to protect the display region.

In this regard, the protective window 100 according to the current exemplary embodiment omits the silsequioxane-containing protective layer 10 from the non-display region that requires relatively low hardness or a region that does not receive touch inputs from a user, thereby reducing the material cost of the protective layer 10.

Figure 7:
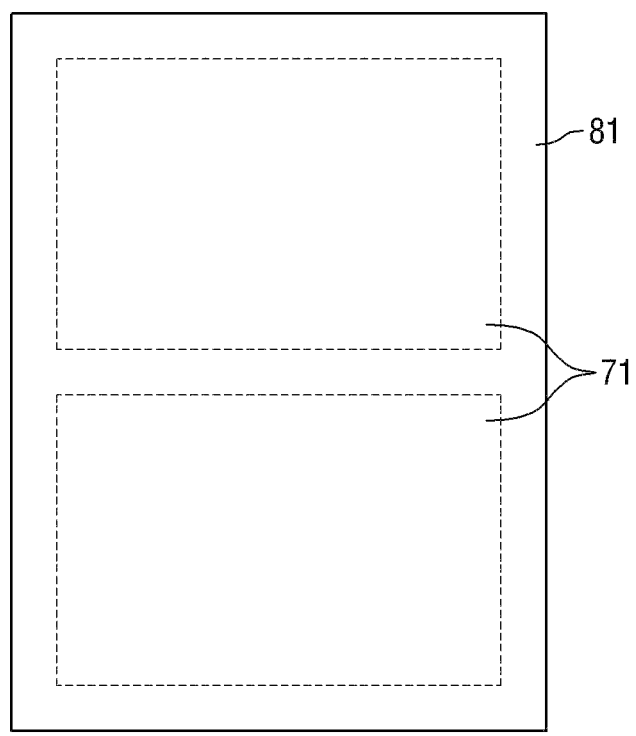
Figure 8:
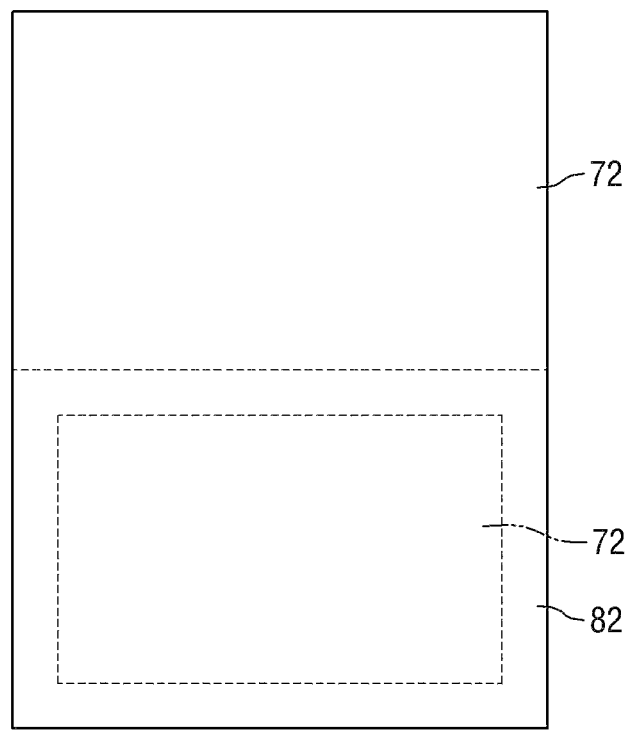

Referring to FIGS. 7 and 8, the first surface of the first transparent member 20 may include the first region 71 or 72 divided into a plurality of sections and the second region 81 or 82 excluding the first region 71 or 72. In some embodiments, the number of sections of the first region 71 or 72 may be two. In some embodiments, the protective layer 10 may be placed on the first region 71 or 72 of the first transparent member 20.

Each of the two separate sections of the first region 71 of the first transparent member 20 may be surrounded by the second region 81 as shown in FIG. 7. Alternatively, one of the two separate sections of the first region 72 of the first transparent member 20 may extend up to the boundary of the first transparent member 20, and the other one of the two separate sections of the first region 72 may be surrounded by the second region 82 as shown in FIG. 8. Although not shown in the drawing, all sections of the first region 72 of the first transparent member 20 may extend up to the boundary of the first transparent member 20.

As user demands for multitasking increase, one display device may adopt a plurality of screens, and these screens may display different images. Alternatively, some of the screens may display images, and the other screens may be used as touch screens. Thus, the display device may display images while receiving touch inputs from a user.

FIGS. 7 and 8 illustrate embodiments of a protective window for such display devices. The protective window omits a silsequioxane-containing protective layer from the non-display region that requires relatively low hardness or a region that does not receive touch inputs from a user, thereby reducing the material cost of the protective layer.

Figure 9:
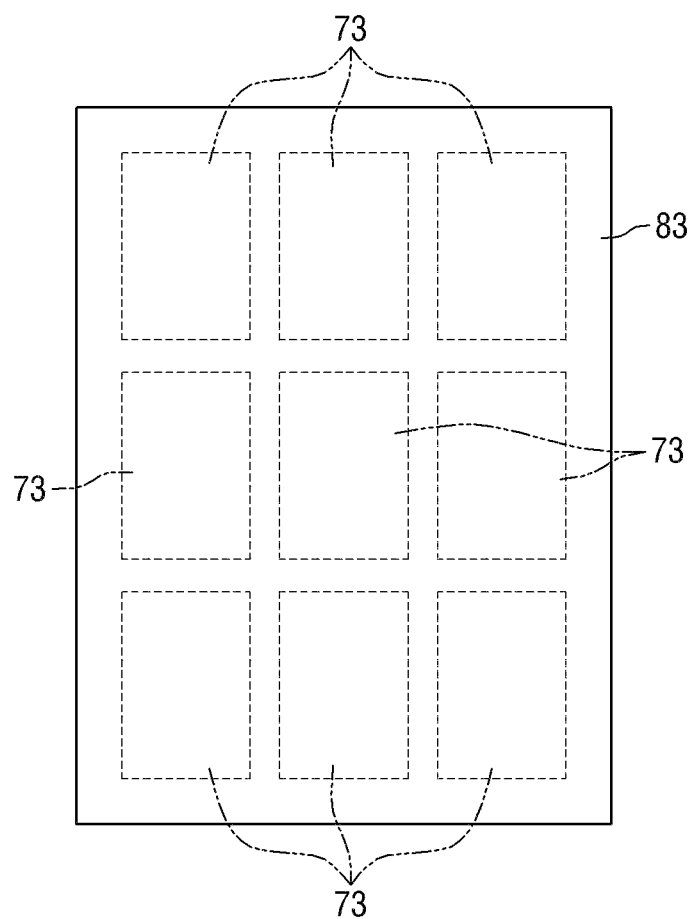

Referring to FIG. 9, the first region 73 of the first transparent member 20 is divided into a plurality of sections by the second region 83, and the protective layer 10 is placed on the sections of the first region 73. In FIG. 9, the first region 73 of the first transparent member 20 is divided into nine sections. However, this is merely an example used for ease of description, and the first region 73 of the first transparent member 20 may be divided into various numbers of sections.

In some embodiments, the protective window 100 may omit the silsequioxane-containing protective layer 10 from the non-display region that requires relatively low hardness or a region that does not receive touch inputs from a user, thereby reducing the material cost of the protective layer 10.

Figure 10:
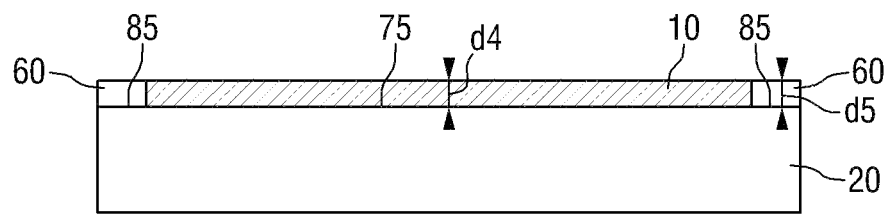
FIGS. 10 and 11 are cross-sectional views of protective windows according to other exemplary embodiments.
Figure 11:
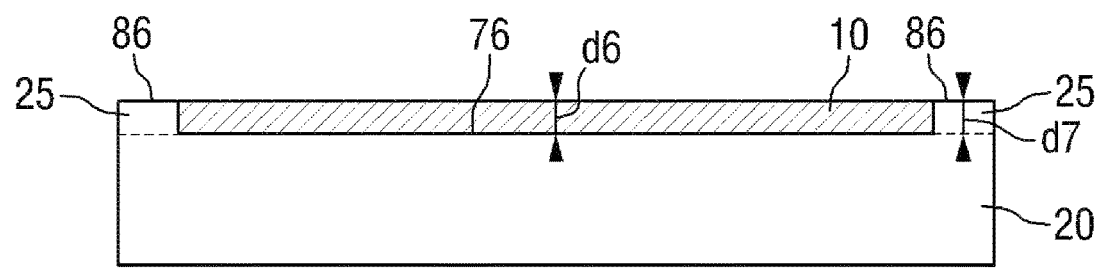
Figure 12:
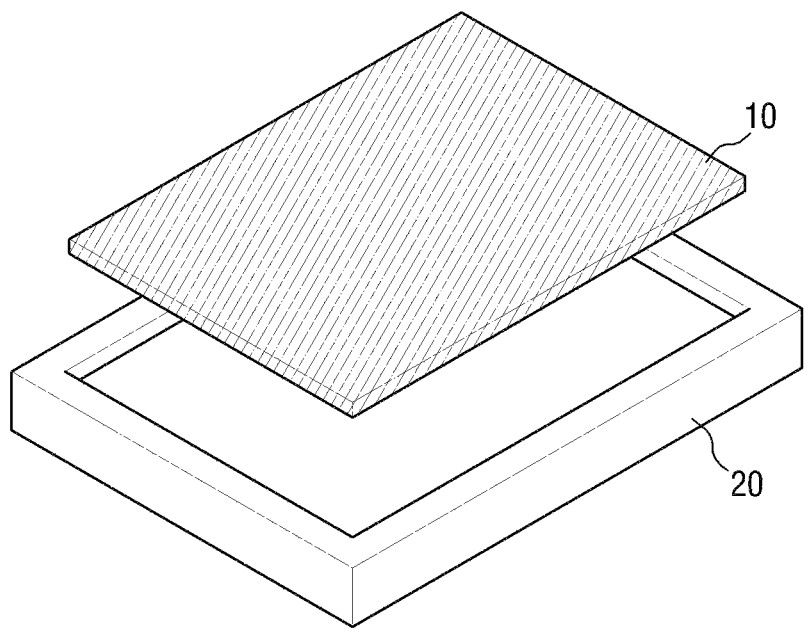
FIG. 12 is an exploded perspective view of the protective window of FIG. 11.

FIGS. 10 and 11 are cross-sectional views of protective windows 100 according to other exemplary embodiments of the present invention. FIG. 12 is an exploded perspective view of the protective window 100 according to the exemplary embodiment.

Referring to FIG. 10, the protective window 100 may include a protective layer 10, a first transparent member 20, and a third transparent member 60. Although not shown in FIG. 10 for ease of description, the protective window 100 may further include a second transparent member and an adhesive member as shown in FIGS. 2 and 3.

A first surface of the first transparent member 20 may include a first region 75 and a second region 85. The first region 75 and the second region 85 of the first transparent member 20 are substantially the same as those described above with reference to FIGS. 4 through 9, and thus a repetitive description thereof is omitted.

In some embodiments, the third transparent member 60 can contain a polymer. In some embodiments, the polymer may be at least one of PC, PMMA, and PET. In some embodiments, the polymer may not be limited to PC, PMMA or PET, but may also be any other polymer having a pencil hardness of approximately 4H or more and having high durability resulting from mechanical safety.

In some embodiments, the third transparent member 60 may be located on the second region 85 of the first surface of the first transparent member 20. Although not shown in FIG. 10, the same is true when the first region 75 of the first surface of the first transparent member 20 is divided into a plurality of sections as described above with reference to FIGS. 7 through 9.

In some embodiments, the third transparent member 60 may be attached to the first transparent member 20. In some embodiments, the third transparent member 60 and the first transparent member 20 may be attached to each other using thermo-compression bonding, a UV light-curing adhesive, a pressure sensitive adhesive, or any other method known to those of ordinary skill in the art to which the present invention pertains.

A thickness d5 of the third transparent member 60 may be equal to a thickness d4 of the protective layer 10. When the thickness d5 of the third transparent member 60 is equal to the thickness d4 of the protective layer 10, a top surface of the protective window 100 which is exposed to the outside environment is flat. In some embodiments, the flat top surface of the protective window 100 can be less damaged by external impact or scratches than a non-flat top surface and improves a user's visibility.

Referring to FIGS. 11 and 12, the protective window 100 may include a protective layer 10 and a first transparent member 20. Although not shown in FIGS. 11 and 12 for ease of description, the protective window 100 may further include a second transparent member and an adhesive member as shown in FIGS. 2 and 3.

A first surface of the first transparent member 20 includes a first region 76 and a second region 86. The first region 76 and the second region 86 of the first transparent member 20 are substantially the same as those described above with reference to FIGS. 4 through 9, and thus a repetitive description thereof is omitted.

In some embodiments, the first transparent member 20 may include a protruding portion 25 which protrudes from the second region 86 of the first surface thereof. Although not shown in FIGS. 11 and 12, the same is true when the first region 76 of the first surface of the first transparent member 20 is divided into a plurality of sections as described above with reference to FIGS. 7 through 9.

A height d7 of the protruding portion 25 may be equal to a thickness d6 of the protective layer 10. The height d7 of the protruding portion 25 is measured in a direction perpendicular to a virtual surface extending from the first region 76 of the first transparent member 20. When the height d7 of the protruding portion 25, which is measured in the direction perpendicular to the virtual surface extending from the first region 76 of the first transparent member 20, is equal to the thickness d6 of the protective layer 10, a top surface of the protective window 100 which is exposed to the outside environment is flat. In some embodiments, the flat top surface of the protective window 100 may be less damaged by external impact or scratches than a non-flat top surface and improves a user's visibility.

Referring to FIG. 12, the first surface of the first transparent member 20 may include a recess portion. In some embodiments, the protective layer 10 may be formed in the recess portion of the first surface of the first transparent member 20. In some embodiments, the protective layer 10 may be formed on the first transparent member 20 by filling the recess portion of the first transparent member 20 with the protective layer 10.

Figure 13:
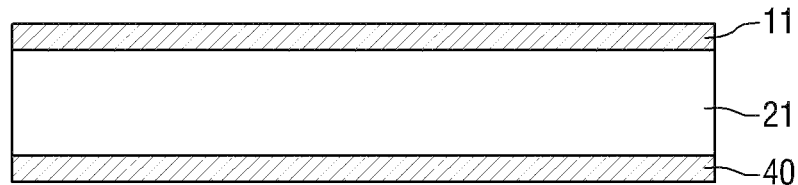
FIG. 13 is a cross-sectional view of a protective window according to another exemplary embodiment.
Figure 14:
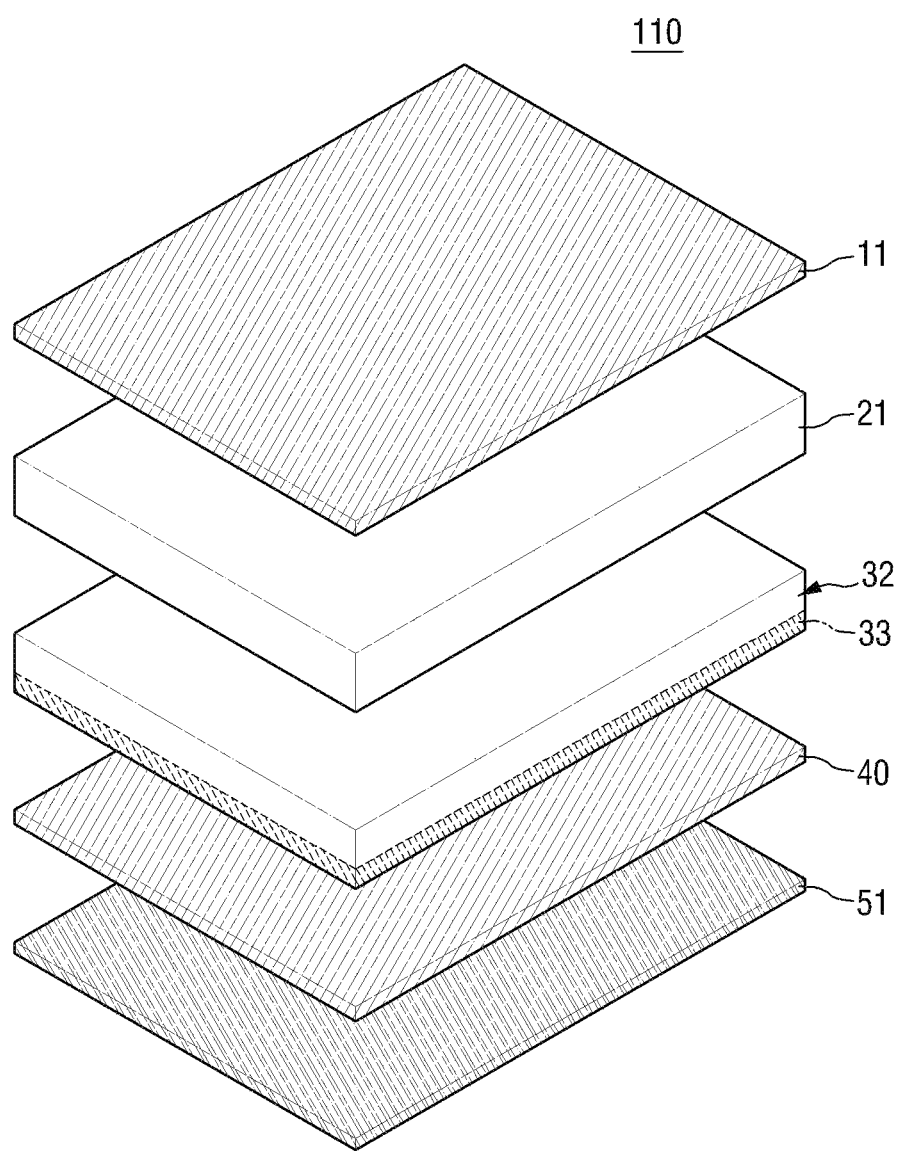
FIG. 14 is an exploded perspective view of a protective window according to another exemplary embodiment.
Figure 15:
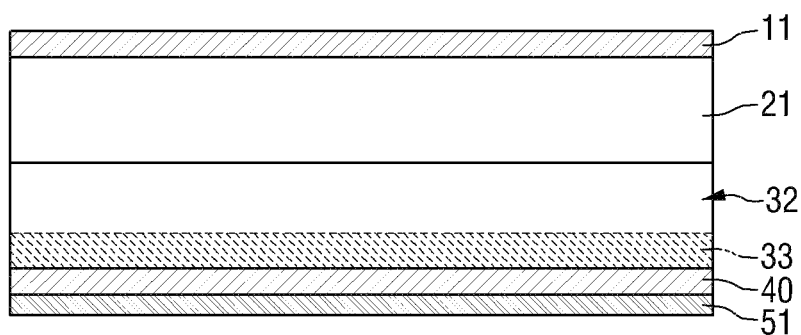
FIG. 15 is a cross-sectional view of the protective window of FIG. 14.

FIG. 13 is a cross-sectional view of a protective window 110 according to another exemplary embodiment. FIG. 14 is an exploded perspective view of the protective window 110 according to another exemplary embodiment. FIG. 15 is a cross-sectional view of the protective window 110 according to the exemplary embodiment of FIG. 14.

Referring to FIG. 13, in some embodiments, the protective window 110 may include a protective layer 11, a first transparent member 21, and a rear layer 40.

The protective layer 11 and the first transparent member 21 can be substantially the same as those described above with reference to FIGS. 1 through 12, and thus a repetitive description thereof is omitted.

The rear layer 40 can be formed on a second surface of the first transparent member 21. The rear layer 40 may be attached to the first transparent member 21. In some embodiments, the rear layer 40 and the first transparent member 21 may be attached to each other using thermo-compression bonding, a UV light-curing adhesive, a pressure sensitive adhesive, or any other method known to those of ordinary skill in the art to which the present invention pertains.

In some embodiments, the rear layer 40 contains silsequioxane. In some embodiments, the silsequioxane-containing rear layer 40 and the silsequioxane-containing protective layer 11 may be disposed in lower and upper parts of the protective window 110 to be symmetrical to each other with respect to the first transparent member 21.

Polymers such as silsequioxane and PC have different moisture absorption rates and heat-resisting properties. Therefore, if a protective layer that contains silsequioxane only is disposed on a first transparent member, a substrate may warp under a high temperature or high moisture condition.

Therefore, the protective window 110 can be structured such that the silsequioxane-containing rear layer 40 and the silsequioxane-containing protective layer 11 are arranged symmetrical to each other with respect to the first transparent member 21. This structure can prevent the distortion of the protective window 110 due to the difference, e.g., in coefficient of thermal expansion (CTE) between silsequioxane and a polymer.

Referring to FIGS. 14 and 15, the protective window 110 according to the present invention may further include a second transparent member 32, which includes a lowest layer 33, between a first transparent member 21 and a rear layer 40 and may further include an adhesive member 51 on a lower surface of the rear layer 40.

In some embodiments, the second transparent member 32 and the adhesive member 51 are substantially the same as those described above with reference to FIGS. 2 and 3, and thus a repetitive description thereof is omitted.

In some embodiments, the rear layer 40 may be formed on a lower surface of the second transparent member 32 when the second transparent member 32 is interposed between the rear layer 40 and the first transparent member 21. In some embodiments, the rear layer 40 may be attached to the second transparent member 32. In some embodiments, the rear layer 40 and the second transparent member 32 may be attached to each other using thermo-compression bonding, a UV light-curing adhesive, a pressure sensitive adhesive, or any other method known to those of ordinary skill in the art to which the present invention pertains.

In some embodiments, the protective window 110 can be structured such that the silsequioxane-containing rear layer 40 and the silsequioxane-containing protective layer 11 are arranged symmetrical to each other with respect to the first transparent member 21 and the second transparent member 32. This structure can prevent the distortion of the protective window 110 due to the difference in CTE between silsequioxane and a polymer.

In FIG. 14, the protective layer 11, the first transparent member 21, the second transparent member 32, the rear layer 40 and the adhesive member 51 is shown shaped like a rectangle. However, this shape is adopted for ease of description only. The above elements may have various shapes according to the shape of a display device to which the protective window 110 is attached.

Figure 16:
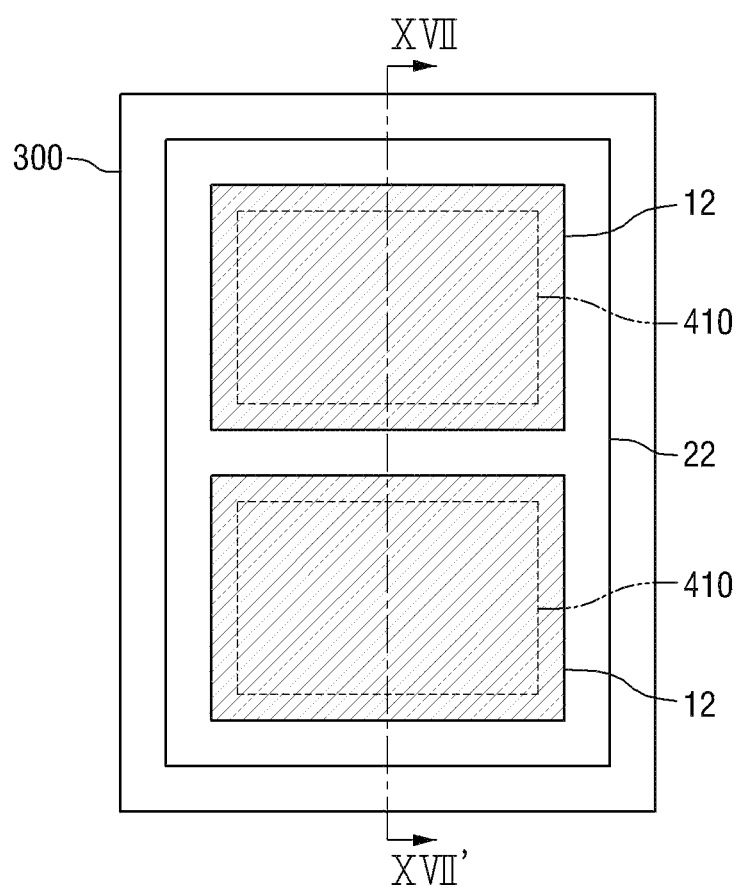
FIG. 16 is a plan view of a display device including a protective window according to an exemplary embodiment.
Figure 17:
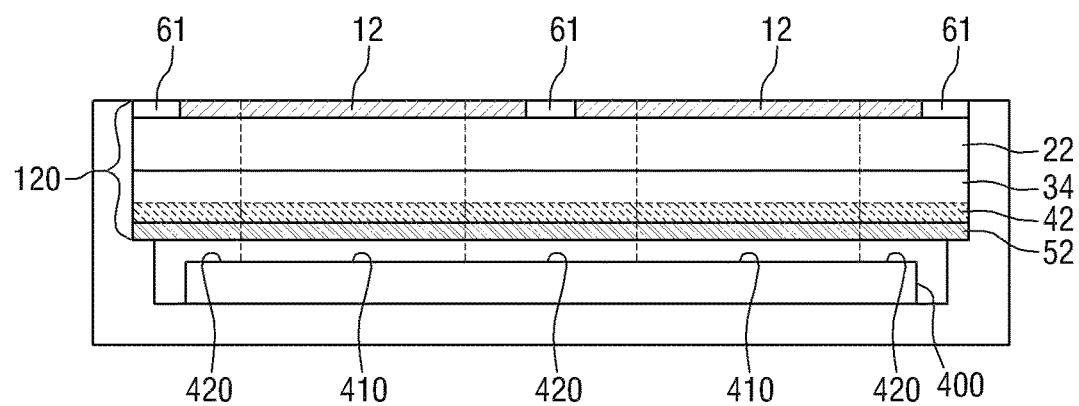
FIG. 17 is a cross-sectional view of the display device taken along the line XVII-XVII' of FIG. 16.

FIG. 16 is a plan view of a display device 1000 including a protective window 120 according to an exemplary embodiment. FIG. 17 is a cross-sectional view of the display device 1000 taken along the line XVII-XVII' of FIG. 16.

Referring to FIG. 17, the display device 1000 includes the protective window 120, a housing member 300, and a display unit 400.

In some embodiments, the protective window 120 may include a protective layer 12, a first transparent member 22, a second transparent member 34, a third transparent member 61, a rear layer 42, and an adhesive member 52.

In some embodiments, the third transparent member 61 can be omitted. In some embodiments, the first transparent member 22 may include a protruding portion as shown in FIGS. 11 and 12 when the third transparent member 61 is omitted.

The protective layer 12, the first transparent member 22, the second transparent member 34, the third transparent member 61, the rear layer 42, and the adhesive member 52 are substantially the same as those described above with reference to FIGS. 1 through 15, and thus a repetitive description thereof is omitted.

In some embodiments, the protective window 120 can be located at an outermost position on a side of the display device 1000 on which an image displayed on the display unit 400 can be seen and protects the display unit 400, described herein and unillustrated elements of the display device 1000.

In some embodiments, the housing member 300 forms the exterior of the display device 1000 and houses and supports the protective window 120, the display unit 400, and the unillustrated elements of the display device 1000.

In some embodiments, the display unit 400 forms an image, and the image can be seen from the outside of the display device 1000 through the protective window 120. In some embodiments, the display unit 400 can be located under the protective window 120. A first surface of the display unit 400 which faces the protective window 120 includes a first region 410 and a second region 420.

In some embodiments, the first region 410 of the display unit 400 may include a display region. In some embodiments, the display region may be a region which includes a plurality of pixels that can display desired colors and thus displays a desired image. Alternatively, the display region may be a region that can display an image of a certain shape only. In some embodiments, the first region 410 of the display unit 400, such as a touch screen, may receive touch inputs from a user while displaying images.

In some embodiments, the second region 420 of the display unit 400 may include a non-display region. In some embodiments, the non-display region may be a region which displays neither a desired shape nor a certain shape.

In some embodiments, the visibility of an image may be reduced when the region of the protective window 120 placed over the display region of the display device 1000 is damaged. In addition, since the region of the protective window 120 over the display region can be touched by a user to input information through a touch screen, it is highly vulnerable to scratches and abrasion, thus requiring high hardness.

Referring to FIG. 17, the protective window 120 can include a protective layer 12 which can be located above the first region 410 of the display unit 400 and overlaps the entire first region 410 of the display unit 400 when seen in a vertical direction from above the display device 1000. In some embodiments, the protective window 120 of the present invention can selectively increase the hardness of its region corresponding to the display region of the display unit 400. Therefore, while the protective window 120 maintains a hardness that guarantees the visibility of an image, it can reduce the material cost of the protective layer 12 compared with a protective window having a protective layer coated on the entire first surface thereof.

The present embodiments will now be described in further detail with reference to the following experimental examples. Information not provided below can be readily inferred by those of ordinary skill in the art, and thus a description thereof will be omitted.

Experimental Example 1: The Surface Hardness, Mechanical Strength, and Environmental Reliability of a Protective Window The pencil hardness, ball drop properties and warping properties of a protective window were measured by varying the thickness of a protective layer, the material of a first transparent member, and the material of a second transparent member as shown in Table 3.

First, the surface hardness of the protective window was measured, and the measured surface hardness was represented by a pencil hardness value. In the present specification, the protective window is determined to be good enough when having a pencil hardness value of 8H or more, which is equivalent to a pencil hardness value of glass, and is determined to be defective when having a pencil hardness value of less than 8H.

The mechanical strength of the protective window was measured, and the measured mechanical strength was represented by ball drop properties. In ball drop experiments, a steel ball weighing 133 g was dropped onto the protective window, and a maximum height that does not cause a dent in the protective window was measured. In the present specification, the protective window is determined to be good enough when left intact in ball drop experiments from a height of 20 cm or more and is determined to be defective when left intact in ball drop experiments from a height of less than 20 cm.

The environmental reliability of the protective window was measured, and the measured environmental reliability was represented by warping properties. In environmental reliability experiments, protective window samples were left under a 85° C. and 85 RH (relative humidity) condition for 120 hours, and then the degrees of warping of the samples were measured.

As described above, samples whose pencil hardness values (indicative of their surface hardness) are not equivalent to that of glass are determined to be defective in the present specification. Therefore, the ball drop and environmental reliability experiments were conducted only on those samples having a pencil hardness of approximately 8 H.

In the above experiments, the thickness of the first transparent member was 50 μm. In addition, the second transparent member included in the protective window was PC or PMMA and had a thickness of 0.8 mm.

TABLE 3

| Sample | Thickness of protective layer | Material of first transparent member | Thickness of adhesive | Material of second transparent member | Pencil hardness | Ball drop | Warping |
|---|---|---|---|---|---|---|---|
| 1 | 50 μm | PET | 5 μm | PC | 3 H | — | — |
| 2 | 50 μm | PET | 5 μm | PMMA | 3 H | — | — |
| 3 | 50 μm | PET | 10 μm | PC | 3 H | — | — |
| 4 | 50 μm | PET | 10 μm | PMMA | 3 H | — | — |
| 5 | 50 μm | PC | 5 μm | PC | 2 H | — | — |
| 6 | 50 μm | PC | 5 μm | PMMA | 2 H | — | — |
| 7 | 50 μm | PC | 10 μm | PC | 2 H | — | — |
| 8 | 50 μm | PC | 10 μm | PMMA | 2 H | — | — |
| 9 | 50 μm | PMMA | 5 μm | PC | 4 H | — | — |
| 10 | 50 μm | PMMA | 5 μm | PMMA | 3 H | — | — |
| 11 | 50 μm | PMMA | 10 μm | PC | 3 H | — | — |
| 12 | 50 μm | PMMA | 10 μm | PMMA | 3 H | — | — |
| 13 | 75 μm | PET | 5 μm | PC | 5 H | — | — |
| 14 | 75 μm | PET | 5 μm | PMMA | 6 H | — | — |
| 15 | 75 μm | PET | 10 μm | PC | 6 H | — | — |
| 16 | 75 μm | PET | 10 μm | PMMA | 6 H | — | — |
| 17 | 75 μm | PC | 5 μm | PC | 3 H | — | — |
| 18 | 75 μm | PC | 5 μm | PMMA | 3 H | — | — |
| 19 | 75 μm | PC | 10 μm | PC | 2 H | — | — |
| 20 | 75 μm | PC | 10 μm | PMMA | 2 H | — | — |
| 21 | 75 μm | PMMA | 5 μm | PC | 3 H | — | — |
| 22 | 75 μm | PMMA | 5 μm | PMMA | 4 H | — | — |
| 23 | 75 μm | PMMA | 10 μm | PC | 3 H | — | — |
| 24 | 75 μm | PMMA | 10 μm | PMMA | 4 H | — | — |
| 25 | 100 μm | PET | 5 μm | PC | 9 H | 20 cm | 0.8 cm |
| 26 | 100 μm | PET | 5 μm | PMMA | 9 H | 35 cm | 1 cm |
| 27 | 100 μm | PET | 10 μm | PC | 8 H | 20 cm | 1 cm |
| 28 | 100 μm | PET | 10 μm | PMMA | 9 H | 35 cm | 1.5 cm |
| 29 | 100 μm | PC | 5 μm | PC | 4 H | — | — |
| 30 | 100 μm | PC | 5 μm | PMMA | 4 H | — | — |
| 31 | 100 μm | PC | 10 μm | PC | 4 H | — | — |
| 32 | 100 μm | PC | 10 μm | PMMA | 4 H | — | — |
| 33 | 100 μm | PMMA | 5 μm | PC | 7 H | 20 cm | 1.8 cm |
| 34 | 100 μm | PMMA | 5 μm | PMMA | 8 H | 30 cm | 2 cm |
| 35 | 100 μm | PMMA | 10 μm | PC | 8 H | 20 cm | 1.8 cm |
| 36 | 100 μm | PMMA | 10 μm | PMMA | 8 H | 30 cm | 2.5 cm |

When it comes to the pencil hardness according to the thickness of the protective layer and the material of the first transparent member shown in the experimental results of Table 3, the $1^{st}$ through $24^{th}$ samples in which the protective layer had a thickness of 50 or 75 μm failed to exhibit good pencil hardness. On the other hand, the $25^{th}$ through $28^{th}$ samples in which the protective layer had a thickness of 100 μm and the first transparent member contained PET exhibited good pencil hardness. The $29^{th}$ through $32^{nd}$ samples in which the protective layer had a thickness of 100 μm and the first transparent member contained PC failed to exhibit good pencil hardness. The $33^{rd}$ through $36^{th}$ samples in which the protective layer had a thickness of 100 μm and the first transparent member contained PMMA exhibited good pencil hardness, except that the 33$^{rd}$ sample had a pencil hardness of 7H.

Therefore, in one embodiment, the thickness of the protective layer should be approximately 100 μm or more in order to form a protective window with good pencil hardness properties.

In another embodiment, the protective layer may have a thickness of approximately 100 to 150 μm.

The first transparent member may contain PET or PMMA to form a protective window having good pencil hardness properties.

As described above, in the present specification, samples are determined to be good enough when having a pencil hardness value of 8H or more, which is equivalent to the pencil hardness value of glass, and are determined to be defective when having a pencil hardness value of less than 8H. Therefore, the ball drop and environmental reliability experiments were conducted only on those samples (the 25$^{th}$ through 28$^{th}$ samples and the 33$^{rd}$ through 36$^{th}$ samples) in which the protective layer had a thickness of 100 μm and the first transparent member contained PET or PMMA, that is, samples having a pencil hardness of 8H or more.

When it comes to the mechanical strength according to the material of the first transparent member and the material of the second transparent member shown in the experimental results of Table 3, all of the 25$^{th}$ through 28$^{th}$ samples in which the first transparent member contained PET were intact in ball drop experiments from a height of 20 cm or more, on average, 27.5 cm, thus exhibiting god mechanical strength properties. All of the 33$^{rd}$ through 36$^{th}$ samples in which the first transparent member contained PMMA were intact in the ball drop experiments from the height of 20 cm or more, on average, 27 cm, thus exhibiting god mechanical strength properties. All of the 25$^{th}$, 27$^{th}$, 33$^{rd}$, and 35$^{th}$ samples in which the second transparent member contained PC were intact in the ball drop experiments from the height of 20 cm or more, on average, 20 cm, thus exhibiting god mechanical strength properties. All of the 26$^{th}$, 16$^{th}$, 34$^{th}$, and 36$^{th}$ samples in which the second transparent member contained PMMA were intact in the ball drop experiments from the height of 20 cm or more, on average, 32.5 cm, thus exhibiting god mechanical strength properties.

The ball drop experiments averaged 20 cm in a case where the second transparent member contained PC. The ball drop experiments averaged 32.5 cm in a case where the second transparent member contained PMMA. Therefore, a protective window that includes a second transparent member that contains PMMA may have a higher mechanical strength.

The warping properties according to the material of the first transparent member and the material of the second transparent member shown in the experimental results of Table 3, the 25$^{th}$ through 28$^{th}$ samples in which the first transparent member contained PET warped 1.075 cm on average. The 33$^{rd}$ through 36$^{th}$ samples in which the first transparent member contained PMMA warped 2.025 cm on average. The 25$^{th}$, 27$^{th}$, 33$^{rd}$ and 35$^{th}$ samples in which the second transparent member contained PC warped 1.35 cm on average. The 26$^{th}$, 28$^{th}$, 34$^{th}$, and 36$^{th}$ samples in which the second transparent member contained PMMA warped 1.75 cm on average.

The warping experiments averaged 1.075 cm in a case where the first transparent member contained PET. The warping experiments averaged 2.025 cm in a case where the first transparent member contained PMMA. That is, better warping properties were obtained in the case where the first transparent member contained PET than in the case where the first transparent member contained PMMA. In addition, while the results of the warping experiments averaged 1.35 cm in a case where the second transparent member contained PC, they averaged 1.75 cm in a case where the first transparent member contained PMMA. Therefore, a protective window including a PET-containing first transparent member and a PMMA-containing second transparent member may have superior warping properties.

In Experimental Example 1, a pressure sensitive adhesive was used. The adhesive is interposed between the first transparent member and the second transparent member and attaches them to each other. Referring to Table 3 showing the experimental results, the thickness of the adhesive does not affect the pencil hardness, mechanical strength and warping properties of the protective window.

Experimental Example 2: The Surface Hardness, Mechanical Strength, and Environmental Reliability of a Protective Window The pencil hardness, ball drop properties and warping properties of a protective window were measured by varying the material of a first transparent member and the thickness of a second transparent member as shown in Table 4.

The pencil hardness, ball drop properties and warping properties are substantially the same as those described above in Experimental Example 1, and thus a repetitive description thereof will be omitted.

In Experimental Example 2, a protective layer had a thickness of 100 μm, the first transparent member had a thickness of 50 μm, and the second transparent member contained PMMA.

TABLE 4

| Sample | Thickness of protective layer | Material of first transparent member | Thickness of second transparent member | Pencil hardness | Ball drop | Warping |
|---|---|---|---|---|---|---|
| 1 | 100 μm | PET | 0.5 mm | 8 H | 20 cm | 0.8 cm |
| 2 | 100 μm | PET | 0.65 mm | 9 H | 30 cm | 1 cm |
| 3 | 100 μm | PET | 0.8 mm | 9 H | 35 cm | 1 cm |
| 4 | 100 μm | PMMA | 0.5 mm | 4 H | | |
| 5 | 100 μm | PMMA | 0.65 mm | 5 H | | |
| 6 | 100 μm | PMMA | 0.8 mm | 8 H | 30 cm | 2 cm |

The first through third samples in which the first transparent member contained PET exhibited good pencil hardness irrespective of the thickness of the second transparent member shown in the experimental results of Table 4. The fourth sample in which the thickness of the second transparent member was 0.5 mm and the fifth sample in which the thickness of the second transparent member was 0.65 mm had unsatisfactory pencil hardnesses of 4H and 5H, respectively from among the fourth through sixth samples in which the first transparent member contained PMMA. The sixth sample in which the thickness of the second transparent member was 0.8 mm had a good pencil hardness of 8 H.

The first transparent member may contain PET and have a thickness of approximately 50 μm to achieve good pencil hardness of the protective window. In this case, the second transparent member may contain PMMA and have a thickness of approximately 0.5 mm or more. Hence, to ensure that the protective window has good pencil hardness, the first transparent member may contain PET and have a thickness of approximately 50 μm. In this case, the second transparent member may contain PMMA and have a thickness of approximately 0.5 mm.

The first transparent member may contain PMMA and have a thickness of approximately 50 μm to achieve good pencil hardness of the protective window. In this case, the second transparent member may contain PMMA and have a thickness of approximately 0.8 mm or more. Hence, to ensure that the protective window has good pencil hardness, the first transparent member may contain PMMA and have a thickness of approximately 50 μm. In this case, the second transparent member may contain PMMA and have a thickness of approximately 0.8 mm.

The first through third samples in which the first transparent member contained PET exhibited good ball drop experimental results irrespective of the thickness of the second transparent member and exhibited better ball drop experimental results as the thickness of the second transparent member increased as shown in the experimental results of Table 4. Ball drop experiments were conducted only on the sixth sample having good pencil hardness properties from among the fourth through sixth samples in which the first transparent member contained PMMA, and the sixth sample was intact in ball drop experiments from up to a height of 30 cm, thus exhibiting good ball drop properties.

The first transparent member may contain PET and have a thickness of approximately 50 μm to achieve good mechanical strength of the protective window. In this case, the second transparent member may contain PMMA and have a thickness of approximately 0.5 mm or more. Hence, to ensure that the protective window has good pencil hardness, the first transparent member may contain PET and have a thickness of approximately 50 μm. In this case, the second transparent member may contain PMMA and have a thickness of approximately 0.5 mm.

The first transparent member may contain PMMA and have a thickness of approximately 50 μm to achieve good mechanical strength of the protective window. In this case, the second transparent member may contain PMMA and have a thickness of approximately 0.8 mm or more. Hence, the first transparent member may contain PMMA and have a thickness of approximately 50 μm to ensure that the protective window has good pencil hardness. In this case, the second transparent member may contain PMMA and have a thickness of approximately 0.8 mm.

The warping properties of the first transparent member and the thickness of the second transparent member are shown in the experimental results of Table 4. The third sample warped 1 cm and the sixth sample warped 2 cm. It can be understood from these experimental results that better warping properties are obtained in a case where the first transparent member contains PET than a case where the first transparent member contains PMMA.

The present embodiments provide at least one of the following advantages.

The present embodiments can provide a protective window having high hardness and high strength.

In addition, warping properties of a protective window can be reduced, and mechanical properties of a display device can be enhanced.

The present embodiments can provide a protective window which is hardly deformed by temperature changes.

However, the effects of the present embodiments are not restricted to the one set forth herein. The above and other effects of the present embodiments will become more apparent by referencing the claims.

What is claimed is:
1. A protective window comprising:
a first transparent member comprising a polymer;
a protective layer which is formed directly on a first surface of the first transparent member and comprises silsequioxane; and
a second transparent member comprising a plurality of layers formed directly on a second surface of the first transparent member, wherein the second transparent member contains at least one of polycarbonate (PC), PMMA, and PET, and a lowest layer of the second transparent member is a PC layer;
wherein the protective layer has a thickness of 100 to 150 μm,
wherein a thickness of the protective layer is greater than a thickness of the first transparent member, and
wherein a thickness of the second transparent member is greater than the thickness of the protective layer.

2. The protective window of claim 1, wherein the polymer is polymethylmethacrylate (PMMA) or polyethylene terephthalate (PET).

3. The protective window of claim 1, wherein the polymer is PET, the second transparent member contains PMMA, the first transparent member has a thickness of approximately 50 μm, and the second transparent member has a thickness of approximately 0.5 mm or more.

4. The protective window of claim 1, wherein the polymer is PMMA, the second transparent member contains PMMA, the first transparent member has a thickness of approximately 50 μm, and the second transparent member has a thickness of approximately 0.8 mm or more.

5. The protective window of claim 1, further comprising an adhesive member under the second transparent member.

6. The protective window of claim 1, wherein the first surface of the first transparent member comprises a first region and a second region, wherein the protective layer is disposed on the first region.

7. The protective window of claim 6, further comprising a third transparent member which is disposed on the second region and contains a polymer, wherein the protective layer has the same thickness as the third transparent member.

8. The protective window of claim 6, wherein the first transparent member comprises a protruding portion on the second region, wherein a height of the protruding portion on the first surface of the first transparent member is equal to the thickness of the protective layer.

9. A protective window comprising:
a first transparent member comprising a polymer, and comprising a plurality of layers;
a protective layer which is formed directly on a first surface of the first transparent member and comprises silsequioxane; and a rear layer which is formed directly on a second surface of the first transparent member and contains silsequioxane;

wherein the protective layer has a thickness of 100 to 150 μm, wherein a layer of the first transparent member which contacts the rear layer is a PC layer, wherein a thickness of the protective layer is greater than a thickness of the first transparent member, and wherein a thickness of the rear layer is greater than the thickness of the protective layer.

10. The protective window of claim 9, wherein the rear layer has a thickness of approximately 100 to 150 μm.

11. The protective window of claim 9, wherein the polymer is PMMA or PET.

12. The protective window of claim 9, further comprising an adhesive member under the rear layer.

13. A display device comprising:
a display unit; and
a protective window which is disposed over the display unit,
wherein the protective window comprises:
a first transparent member which contains a polymer;
a protective layer which is formed directly on a first surface of the first transparent member and contains silsequioxane; and
a second transparent member comprising a plurality of layers, and is formed directly on a second surface of the first transparent member, wherein the second transparent member comprises at least one of polycarbonate (PC), PMMA, and PET, and a lowest layer of the second transparent member is a PC layer;

wherein the protective layer has a thickness of 100 to 150 μm, wherein a thickness of the protective layer is greater than a thickness of the first transparent member, and wherein a thickness of the second transparent member is greater than the thickness of the protective layer.

14. The display device of claim 13, wherein a surface of the display unit which faces the protective window comprises a first display unit region and a second display unit region, wherein the protective layer is disposed above the first display unit region.

15. The display device of claim 14, wherein the protective window comprises a third transparent member comprising a polymer, situated above the second display unit region, and is disposed on the first surface of the first transparent member.

16. The display device of claim 15, wherein the first display unit region is a display region, and the second display unit region is a non-display region.

17. The display device of claim 13, wherein the polymer is PMMA or PET.

18. The display device of claim 13, wherein the protective window comprises a rear layer which is formed on the second surface of the first transparent member and comprising silsequioxane.

* * * * *